(12) United States Patent
Yang et al.

(10) Patent No.: US 8,908,415 B2
(45) Date of Patent: Dec. 9, 2014

(54) RESISTIVE MEMORY RESET

(71) Applicant: Taiwan Semiconductor Manufacturing Company, Ltd., Hsin-Chu (TW)

(72) Inventors: Chin-Chieh Yang, New Taipei (TW); Wen-Ting Chu, Kaohsiung (TW); Kuo-Chi Tu, Hsin-Chu (TW); Yu-Wen Liao, New Taipei (TW); Chih-Yang Chang, Yuanlin Township, Changhua County (TW); Hsia-Wei Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/782,632

(22) Filed: Mar. 1, 2013

(65) Prior Publication Data

US 2014/0247644 A1 Sep. 4, 2014

(51) Int. Cl.
*G11C 11/00* (2006.01)
*G11C 13/00* (2006.01)

(52) U.S. Cl.
CPC ........ *G11C 13/0097* (2013.01); *G11C 13/0007* (2013.01); *G11C 13/0004* (2013.01)
USPC .................. 365/148; 365/46; 365/55; 365/74; 365/97; 365/100; 365/131; 365/163; 365/158; 365/171

(58) Field of Classification Search
CPC ........... G11C 13/0007; G11C 13/0069; G11C 2213/79; G11C 2213/31; G11C 2213/34; G11C 2013/009; G11C 2013/0052; G11C 2013/004; G11C 2013/0061
USPC ......... 365/163, 46, 55, 74, 97, 100, 131, 148, 365/158, 171, 173
See application file for complete search history.

(56) References Cited

U.S. PATENT DOCUMENTS

| | | | |
|---|---|---|---|
| 6,677,637 B2 | 1/2004 | Bernstein et al. | |
| 6,737,728 B1 | 5/2004 | Block et al. | |
| 6,781,185 B2 | 8/2004 | Chen et al. | |
| 6,803,641 B2 | 10/2004 | Papa Rao et al. | |
| 6,849,891 B1 | 2/2005 | Hsu et al. | |
| 6,936,881 B2 | 8/2005 | Yeo et al. | |
| 6,937,457 B2 | 8/2005 | Shih et al. | |
| 6,940,705 B2 | 9/2005 | Yeo et al. | |
| 7,195,970 B2 | 3/2007 | Tu et al. | |
| 7,272,035 B1* | 9/2007 | Chen et al. | 365/158 |
| 7,407,858 B2 | 8/2008 | Li et al. | |
| 7,557,399 B2 | 7/2009 | Tu et al. | |
| 8,000,128 B2 | 8/2011 | Li et al. | |
| 8,009,454 B2 | 8/2011 | Lee et al. | |
| 2008/0025070 A1* | 1/2008 | Horii et al. | 365/148 |
| 2011/0069529 A1* | 3/2011 | Srinivasan et al. | 365/148 |

OTHER PUBLICATIONS

H. S. Philip Wong et al., "Metal—Oxide RRAM," Proceedings of the IEEE, vol. 100, No. 6, Jun. 2012, pp. 1951-1970.

* cited by examiner

*Primary Examiner* — Fernando Hidalgo
(74) *Attorney, Agent, or Firm* — Haynes and Boone, LLP

(57) ABSTRACT

A resistive memory cell includes a switch and a resistive switching device. The switch includes a first terminal connected to a select line and a gate terminal connected to a word line. The resistive switching device is connected between a second terminal of the switch and a bit line. The resistive switching device is resettable by having a positive bias applied to the word line and a negative bias applied to the bit line.

20 Claims, 5 Drawing Sheets

|  | Word Line | | Bit Line | | Select Line | |
| --- | --- | --- | --- | --- | --- | --- |
|  | Selected | Unselected | Selected | Unselected | Selected | Unselected |
| Forming (220) | 1.1 | 0 | 3.0 – 5.0 | 0 | 0 | 0 |
| Set (222) | 1.1 | 0 | 1.3 – 1.5 | 0 | 0 | 0 |
| Reset (224) | 1.5 – 1.7 | 0 | -0.3 | 0 | 1.5 – 1.7 | 0 |
| Read (226) | 1.1 | 0 | 0.3 | 0 | 0 | 0 |

Fig. 2

RESISTIVE MEMORY RESET

BACKGROUND

There is a frequent demand for smaller devices with more memory, including non-volatile memory. Some efforts have been initiated in resistive memory as a mechanism for creating more memory in less space. Resistive memory systems use a resistive element that can change and maintain the value of its resistivity based on applied conditions. For example, a high resistive state may be used to represent a logical '1' while a low resistive state may be used to represent a logical '0'. The various operations performed on a resistive memory cell include write, read and reset operations. The reset operation is used to erase the memory and prepare it for a subsequent write operation. The voltage used to reset the resistive memory cell is relatively high, and may be higher than is desirable for certain memory cell components.

For example, it may take approximately two volts of applied voltage to reset the resistive switching device. That voltage, however, may be outside the preferred operations of a transistor within the memory cell and may thus cause damage. It is desirable to be able to adequately reset a resistive switching device without applying too high of a voltage to certain memory cell components.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a chart showing illustrative operations for a resistive memory cell, according to one example of principles described herein.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
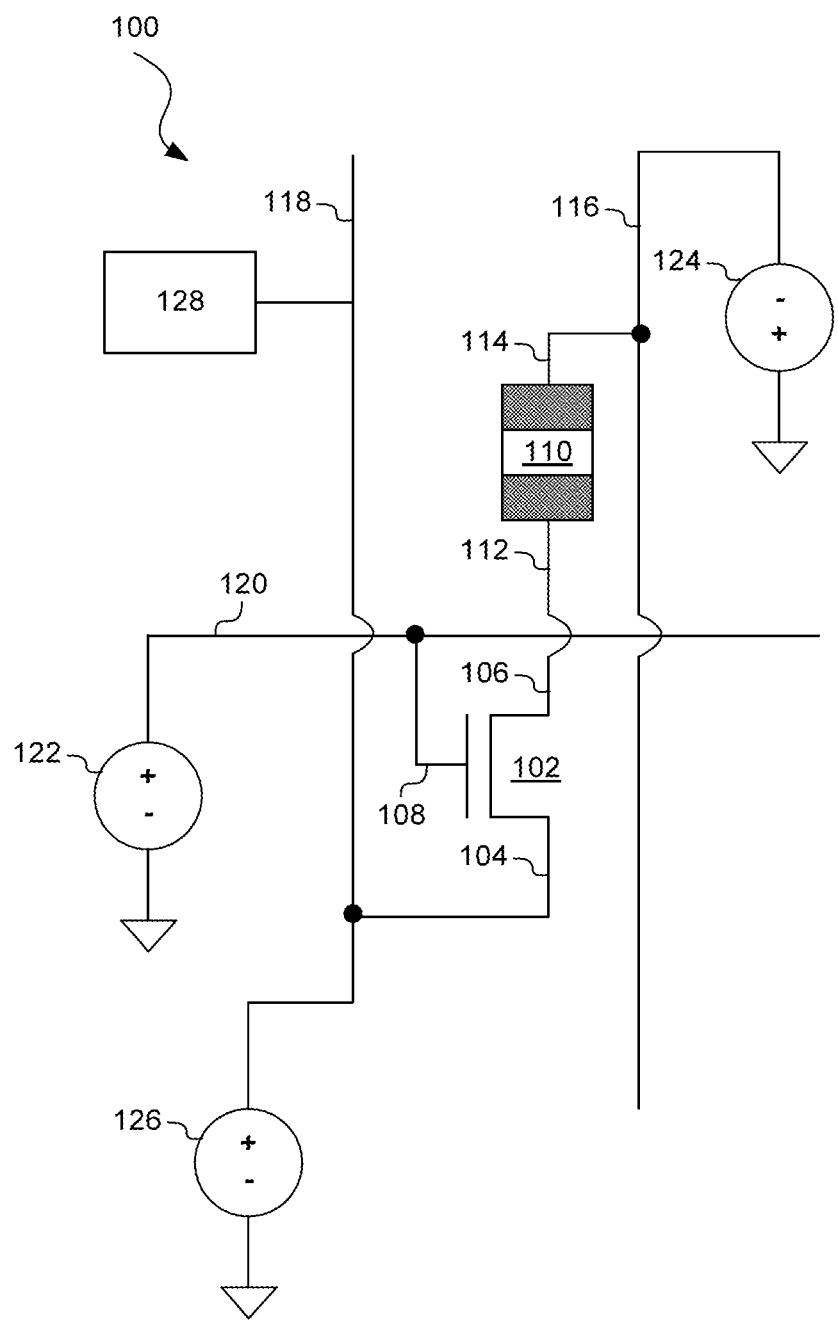
FIG. 1A is a diagram showing an illustrative resistive memory cell, according to one example of principles described herein.

FIG. 1A is a diagram showing an illustrative example of a resistive memory cell 100. According to the present example, the memory cell 100 includes a switch 102 and a resistive switching device 110. The memory cell 100 is connected to a word line 120, a bit line 116, and a select line 118.

The switch 102 may be a transistor device such as a Metal Oxide Semiconductor Field Effect Transistor (MOSFET) device. While illustrated as such, it is understood that other types of switches may be used. Particularly, different types of transistors may be used in accordance with principles described herein.

Continuing with the present example, the gate terminal 108 of the switch 102 is connected to the word line 120. Additionally, a first terminal 104 of switch 102 is connected to the select line 118. Furthermore, a second terminal 106 of the switch 102 is connected to a first terminal 112 of the resistive switching device 110. The second terminal 114 of the resistive switching device 110 is connected to the bit line 116.

Memory cells are often organized into arrays, arranged in rows and columns. A word line driver will selectively assert a word line, which is connected to a row of memory cells each storing a bit of information. When a word line is asserted, each of the connected memory cells provides its stored bit of information on one or more bit lines. The bit lines are provided to sense amplifiers, which are used to select one or more columns of the array and amplify the stored bit(s) of information accordingly. The configuration of bit lines and word lines described herein are merely one embodiment of a memory array.

In the present example, the resistive switching device 110 is a metal-insulator-metal device. Such a device exhibits a resistive state that is based on both present and past electrical conditions. For example, a particular voltage applied may set the resistive switching device 110 into a high resistive state. Additionally, a sufficient voltage of opposite polarity may set the resistive switching device 110 into a relatively low resistive state.

According to certain illustrative examples, the metal-insulator-metal resistive switching device 110 may include a dielectric layer between a top electrode and a bottom electrode. The electrodes may be made of a variety of conductive materials such as metals or metal nitrides. The dielectric layer may be made of a one of several metal oxides such as titanium dioxide ($TiO_2$).

A resistive memory cell stores data in the resistive state of the resistive switching device 110. For example, a high resistive state may represent a logical '1' while a low resistive state may represent a logical '0'. To write or set the state of the resistive memory cell 100, a voltage 122 is applied to the word line 120 connected to that cell. That voltage 122, which is applied to the gate terminal of switch 102, sets the switch 102 to an ON mode. In the ON mode, electric current is allowed to flow between the first terminal 104 and the second terminal 106 of the switch 102. With the voltage 122 applied to the word line 120, the switch for each memory cell along that word line is turned to the ON mode. To actually write to a particular memory cell along that word line, a voltage 124 is applied to the bit line 116 of that particular memory cell. To change the state of the resistive switching device 110, the voltage 124 is of sufficient strength for the particular type of resistive switching device 110 being used.

To read the state of a resistive memory cell 100, the voltage 122 is applied to the word line 120 connected to that memory cell 100. Additionally, the select line 118 connected to the memory cell 100 is connected to a sense amplifier 128. Then, a voltage 124 is applied to the bit line 116 connected to the memory cell 100. During the read operation, the voltage 124 is substantially lower so as not to affect the state of the resistive switching device 110. With the small voltage 124 applied, the sense amplifier 128 will detect an electric current. The strength of this electric current will be dependent upon the resistive state of the resistive switching device 110. Thus, the state of the resistive switching device 110 is determined based on the signal detected by the sense amplifier 128.

During operation of a memory array having resistive memory cells, the memory cells will occasionally be reset. To reset a resistive memory cell is to set the device back to its default state. For example, it may be the case that the resistive memory device 110 is in a high resistive state by default. During various write operations, this state may change. Before, the memory cell can be written to again, it has to be reset.

Figure 1B:
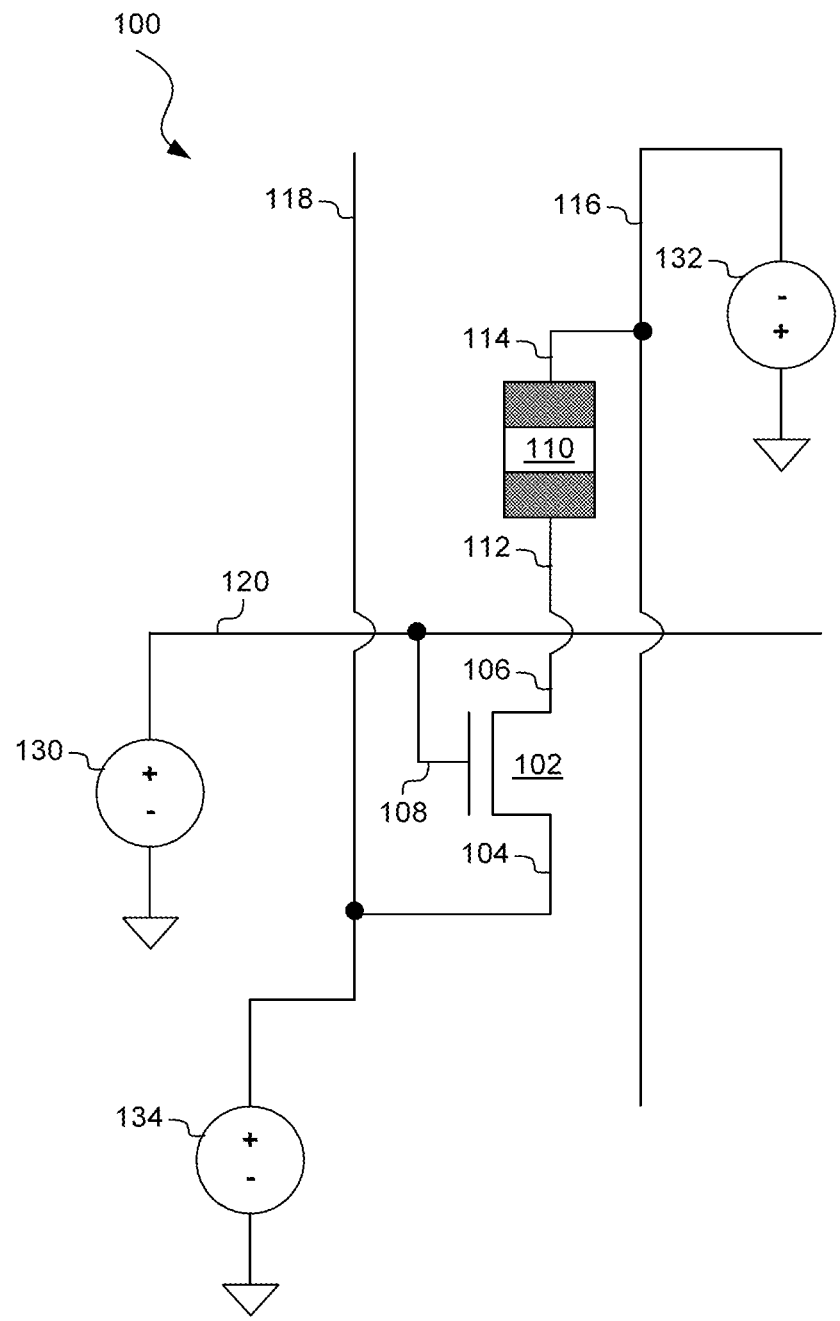
FIG. 1B is a diagram showing an illustrative reset operation for a resistive memory cell, according to one example of principles described herein.

FIG. 1B is a diagram showing an illustrative reset circuit operation for a resistive memory cell 100. According to certain illustrative examples, to reset the resistive memory cell 100, a reset voltage 134 is applied to the select line 118 connected to the memory cell 100. This voltage 134 is high enough to create an electric current such that when flowing through the switch, resets the state of the resistive switching device back to its default state. When using a MOSFET device as the switch 102, a higher voltage 130 also has to be applied to the gate 108 in order to allow the relatively high reset voltage 134 to be applied at the first terminal 104 of the switch. Specifically, the voltage differential between the gate 106 and the second terminal 106 must be sufficiently high in order to keep the switch in the ON mode. Higher voltages, however, when applied to the gate 108, can cause damage to the switch 102 and introduce operating errors into the memory array.

According to certain illustrative examples, in order to reduce the voltage applied at the gate, a negative bias voltage 132 is applied to the bit line 116 of the memory cell 100 while the positive bias voltage 130 is applied to the word line. This allows for a lower voltage to be applied to the gate 108 of the switch 102 while still maintaining the appropriate voltage differential between the gate 108 and the second terminal 106 to keep the switch in the ON mode. If no negative bias voltage were applied, then the positive bias voltage would have to be higher in order to keep the switch 102 in the ON mode while applying the relatively high reset voltage 134. This higher positive voltage 130 increases the risk of damage to the switch 102. Thus, by applying the negative bias voltage 132, there is less risk of damage to the switch 102 and the reset operation can still be performed effectively.

In some examples, the timing of the application of the positive bias voltage 130 and the negative bias voltage 132 is such that there is an overlap of at least a predetermined amount of time. For example, it may be important to apply the reset voltage 134 for at least 5 milliseconds. Thus, the reset voltage 134, positive bias voltage 130, and negative bias voltage 132 may also be applied for at least that long.

FIG. 2 is a chart 200 showing illustrative operations for a resistive memory cell. The chart 200 provides examples of voltage values or ranges that may be applied to the different lines connected to a particular memory cell. The chart 200 includes a word line column, a bit line column 204, and a select line column 206. Each column is divided into a selected column and an unselected column. Specifically, the word line column 202 includes a selected column 208 and an unselected column 210. Likewise, the bit line column 204 includes a selected column 212 and an unselected column 214. The select line column 206 also includes a selected column 216 and an unselected column 218.

For the forming operation 220, a voltage of 1.1 is applied to the word line connected to a target memory cell. The target memory cell is the one which is intended to be operated upon. A selected line is the line connected to the target memory cell while the unselected lines are those which are not connected to the target memory cell. All the word lines which are not connected to the target memory cell, or the unselected word lines, have zero volts applied thereto. Additionally, a voltage between 3.0 and 5.0 is applied to the bit line connected to the target memory cell. Zero volts are applied to the remaining selected and unselected lines. This formation process is a one-time operation that sets up a newly fabricated memory cell for regular operation.

For the set operation 222, a voltage of about 1.1 is applied to the word line connected to the target memory cell. As mentioned above, this sets the switch of the target memory cell into an ON state. In this state, a write voltage between 1.3 and 1.5 volts is applied to the bit line connected to the target memory cell. Zero volts are applied to the remaining selected lines and unselected lines.

For the read operation 226, a voltage of about 1.1 is applied to the word line connected to the target memory cell. Additionally, a read voltage of about 0.3 volts is applied to the bit line connected to the target memory cell. Zero volts are applied to the remaining selected lines and unselected lines.

According to certain illustrative examples, for the reset operation 224, a positive bias voltage of about 1.5 volts to 1.7 volts is applied to the word line connected to the target memory cell. Additionally, a negative bias voltage of about −0.3 volts is applied to the bit line connected to the target memory cell. In some examples, the negative bias voltage may range from about −0.2 volts and −0.4 volts. This allows for a reset voltage of about 1.5 volts to 1.7 volts to be applied to the reset line of the memory cell. Through application of such voltages, the switch stays in an ON mode, or active mode, where electric current is allowed to flow between the two terminals 104, 106. Additionally, this current is strong enough to reset the resistive state of the resistive switching device of the memory cell.

Figure 3:
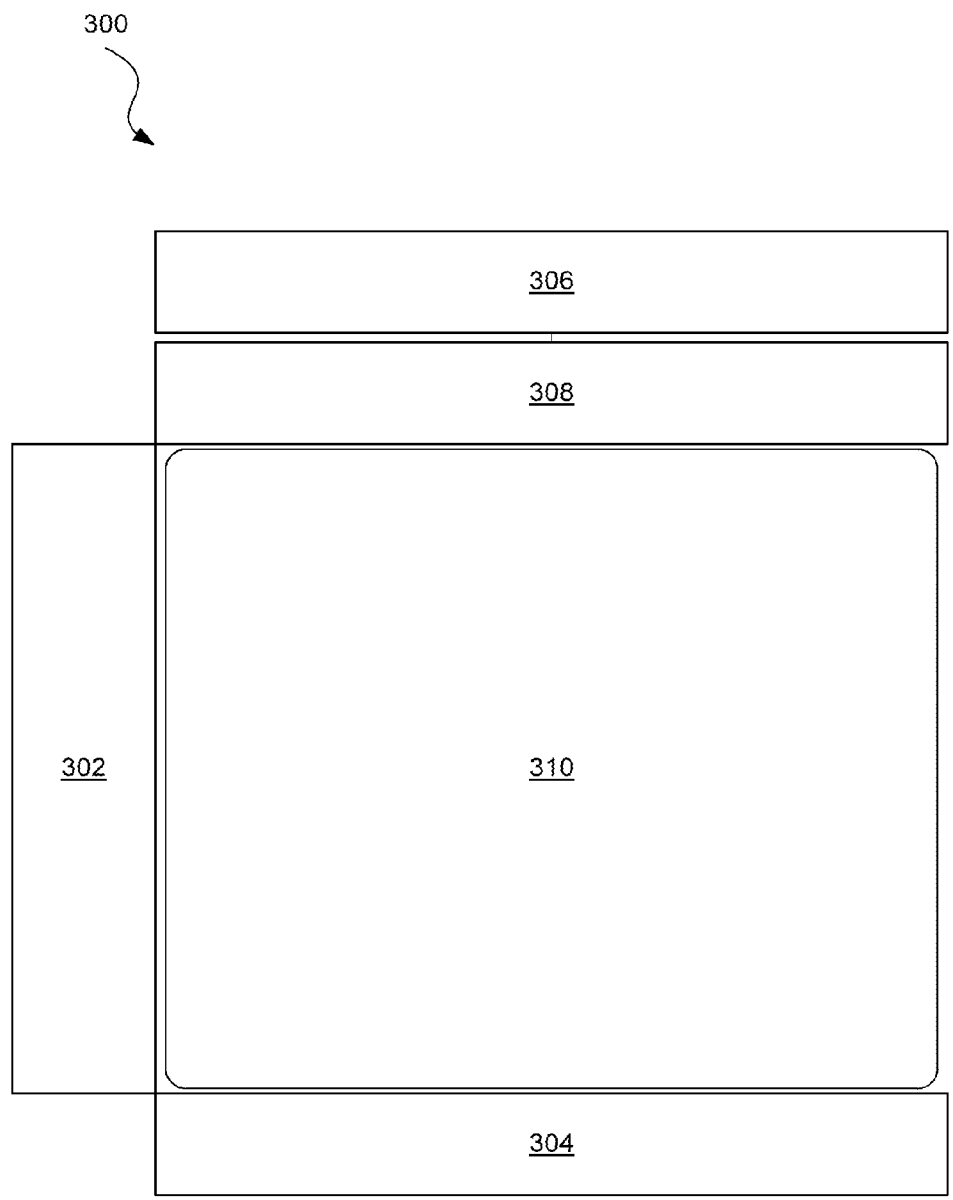
FIG. 3 is a diagram showing an illustrative resistive memory array, according to one example of principles described herein.

FIG. 3 is a diagram showing an illustrative resistive memory array 300. As mentioned above, the memory cell described above may be part of a memory array. According to certain illustrative examples, the memory array may include a set 312 of memory cells surrounded by control circuitry.

According to certain illustrative examples, the control circuitry 302 for the word lines may be placed on one side of the array 300. This circuitry 302 includes the various components that select and apply signals to specific word lines within the array 300.

According to certain illustrative examples, control circuitry 304 for the bit lines may be placed on a different side of the array 300. The bit line circuitry 304 includes the various components that select and apply certain signals to specific bit lines within the array. Additionally, the control circuitry 306 for the select lines may be placed on the opposite side of the set 310 of memory cells from the bit lines control circuitry 304. The select lines control circuitry 306 includes the various components that select and apply signals to various select lines.

According to certain illustrative examples, the control circuitry 308 for the sense amplifiers as well as the sense amplifiers themselves may be placed between the set 310 of memory cells and the control circuitry 306 for the select lines. The control circuitry 308 for the sense amplifiers can operate in accordance with the control circuitry 306 for the select lines so that certain select lines can be connected to specific sense amplifiers at specific times. The sense amplifiers can be used to read the state of a memory cell within the memory array 300.

Figure 4:
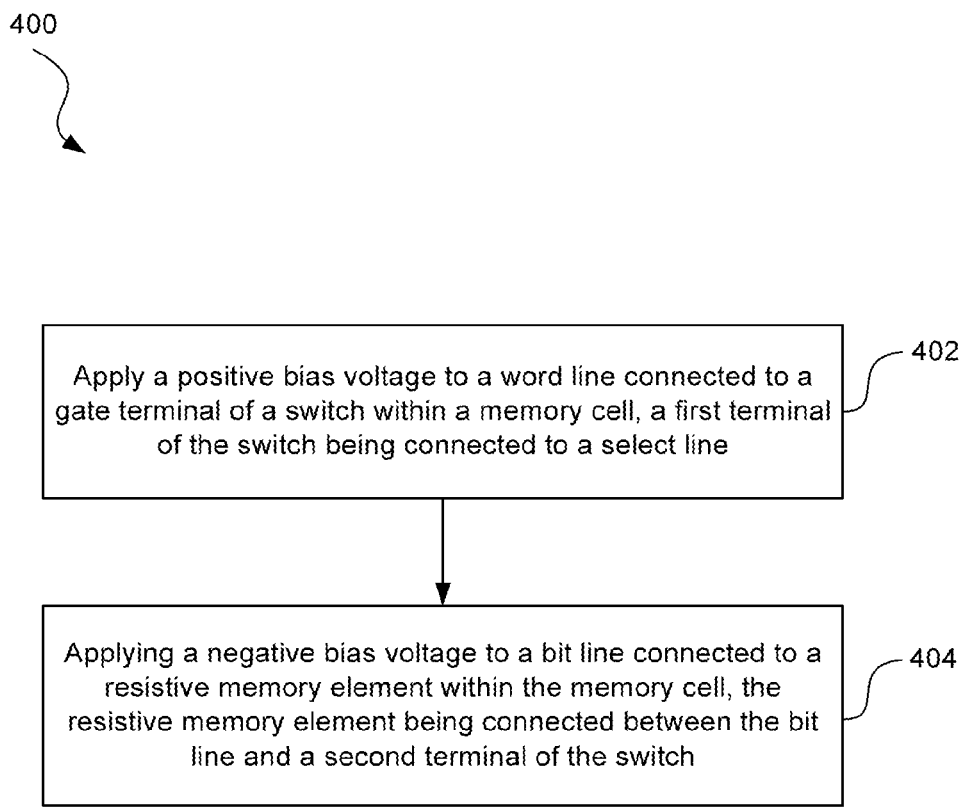
FIG. 4 is a flowchart showing an illustrative method for resetting a resistive memory cell, according to one example of principles described herein.

FIG. 4 is a flowchart showing an illustrative method 400 for resetting a resistive memory cell. According to certain illustrative examples, the method includes a step 402 of applying a positive bias voltage to a word line connected to a gate terminal of a switch within the memory cell, a first terminal of the switch being connected to a select line. The method further includes a step 404 of applying a negative bias voltage to a bit line connected to a resistive switching device within the memory cell, the resistive switching device being connected between the bit line and a second terminal of the switch.

According to certain illustrative examples, a method for resetting a resistive memory cell includes applying a positive bias voltage to a word line connected to a gate terminal of a switch within the memory cell, a first terminal of the switch being connected to a select line. The method further includes applying a negative bias voltage to a bit line connected to a resistive switching device within the memory cell, the resistive switching device being connected between the bit line and a second terminal of the switch.

According to certain illustrative examples, a resistive memory cell device includes a switch comprising a first terminal connected to a select line and a gate terminal connected to a word line. The device also includes a resistive switching device connected between a second terminal of the switch and a bit line. The resistive switching device is to be reset by having a positive bias applied to the word line and a negative bias applied to the bit line.

According to certain illustrative examples, a resistive memory array includes a number of memory cells. Each memory cell includes a switch having a gate terminal connected to a word line, a first terminal connected to a select line, and a second terminal. Each memory cell also includes a resistive switching device having a first terminal connected to the second terminal of the switch, and a second terminal connected to a bit line. A selected memory cell within the memory array is to be reset by applying a positive bias voltage to the word line and a negative bias voltage to the bit line, the bias voltages being such that the switch is in an ON mode while keeping the positive bias voltage lower than a predefined level, the predetermined level being based on reducing damage to the switch due to high voltages.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. The terms "positive" and "negative" are intended to be relative, in that one represents a polarity opposite from the other. Also, the above-listed example voltages are intended to be relative terms, in that they represent a potential difference from a base voltage. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for resetting a resistive memory cell, the method comprising:
    resetting the memory cell by:
        applying a first voltage to a select line connected to a first terminal of a switch within the memory cell, a gate terminal of the switch being connected to a word line; and
        applying a second voltage to a bit line connected to a resistive switching device within the memory cell, the resistive switching device being connected between the bit line and a second terminal of the switch; and
    setting the memory cell by:
        applying a third voltage to the bit line; and
        applying about zero volts to the select line;
    wherein the first and second voltages are of opposite polarity, the first and third voltages are of the same polarity, and the first voltage has a greater magnitude than the third voltage.

2. The method of claim 1, wherein a timing of applying the first voltage and a timing of applying the second voltage overlap for at least a predetermined period of time.

3. The method of claim 1, wherein the first voltage and the second voltage are such that the switch is in an ON mode while applying a reset voltage of sufficient strength to reset a resistive state of the resistive switching device.

4. The method of claim 1, wherein the first voltage is within a range of about 1.5 volts to 1.7 volts.

5. The method of claim 1, wherein the second voltage is within a range of about −0.2 volts to −0.4 volts.

6. The method of claim 1, wherein the first voltage is about 1.6 volts and the second voltage is about −0.3 volts.

7. The method of claim 1, wherein both the first voltage and the second voltage are applied for about 5 milliseconds.

8. The method of claim 1, further comprising, applying a fourth voltage to the word line while applying the first voltage to the select line and while applying the second voltage to the bit line.

9. The method of claim 8, wherein the reset voltage is within a range of about 1.5 volts to 1.7 volts.

10. The method of claim 1, wherein the resistive switching device comprises a metal-insulator-metal device.

11. A resistive memory cell device comprising:
a switch comprising a first terminal connected to a select line and a gate terminal connected to a word line; and
a resistive switching device connected between a second terminal of the switch and a bit line;
wherein the resistive switching device is resettable by having a positive bias applied to the word line, a positive bias applied to the select line, and a negative bias applied to the bit line;
wherein the resistive switching device is settable by having a positive bias applied to the bit line and about zero bias applied to the select line; and
wherein the positive bias applied to the select line is greater than the positive bias applied to the bit line.

12. The device of claim 11, wherein the resistive switching device is resettable by applying the positive bias to the word line for at least a predetermined period of time that overlaps with applying the negative bias.

13. The device of claim 11, wherein the positive bias to the word line and the negative bias are such that the switch is put into an ON mode while keeping the positive bias to the word line enough to reduce damage to the switch to a predetermined level.

14. The device of claim 11, wherein the positive bias to the word line is within a range of about 1.5 volts to 1.7 volts.

15. The device of claim 11, wherein the negative bias is within a range of about −0.2 volts to −0.4 volts.

16. The device of claim 11, wherein the positive bias to the word line voltage is about 1.6 volts and the negative bias is about −0.3 volts.

17. The device of claim 11, wherein both the positive bias to the word line and the negative bias are applied for about 5 milliseconds.

18. The device of claim 11, further comprising, applying a reset voltage to the select line while applying the positive bias to the word line to the word line and while applying the negative bias voltage to the bit line.

19. The device of claim 11, wherein the resistive switching device comprises a metal-insulator-metal device.

20. A resistive memory array comprising a number of memory cells, each memory cell comprising:
a switch comprising:
a gate terminal connected to a word line;
a first terminal connected to a select line; and
a second terminal;
a resistive switching device comprising:
a first terminal connected to the second terminal of the switch;
a second terminal connected to a bit line;
wherein a selected memory cell is to be reset by applying a positive bias voltage to the word line and a negative bias voltage to the bit line, the bias voltages being such that the switch is in an ON mode while keeping the positive bias voltage lower than a predefined level, the predetermined level being based on reducing damage to the switch due to high voltages; and
wherein the selected memory cell is set by applying a positive bias applied to the bit line and applying about zero bias to the select line, the positive bias applied to the select line being greater than the positive bias applied to the bit line.

* * * * *